(12) United States Patent
Hrunski et al.

(10) Patent No.: US 12,365,978 B2
(45) Date of Patent: Jul. 22, 2025

(54) DIAPHRAGM ASSEMBLY FOR DELIMITING THE COATING REGION OF A SPUTTER SOURCE, AND SPUTTERING DEVICE

(71) Applicant: Solayer GmbH, Karlstein (DE)

(72) Inventors: Dzmitry Hrunski, Aschaffenburg (DE); Markus Kress, Mühlheim am Main (DE); Marco Seibert, Langen (DE); Florian Peter Schwarz, Aschaffenburg (DE)

(73) Assignee: Solayer GmbH, Karlstein (DE)

( * ) Notice: Subject to any disclaimer, the term of this patent is extended or adjusted under 35 U.S.C. 154(b) by 0 days.

(21) Appl. No.: 18/256,116

(22) PCT Filed: Dec. 6, 2021

(86) PCT No.: PCT/DE2021/200240
§ 371 (c)(1),
(2) Date: Jun. 6, 2023

(87) PCT Pub. No.: WO2022/122095
PCT Pub. Date: Jun. 16, 2022

(65) Prior Publication Data
US 2024/0035142 A1 Feb. 1, 2024

(30) Foreign Application Priority Data
Dec. 7, 2020 (DE) .......................... 202020107045.2

(51) Int. Cl.
*C23C 14/04* (2006.01)
*C23C 14/34* (2006.01)
(Continued)

(52) U.S. Cl.
CPC ............ *C23C 14/042* (2013.01); *C23C 14/34* (2013.01); *C23C 14/505* (2013.01); *C23C 14/545* (2013.01)

(58) Field of Classification Search
CPC .................................................... C23C 14/042
(Continued)

(56) References Cited

U.S. PATENT DOCUMENTS 2,160,981 A * 6/1939 O'Brien .................. C03C 17/09
118/301
4,410,407 A * 10/1983 Macaulay ............... H01J 37/34
204/298.11
(Continued)

FOREIGN PATENT DOCUMENTS

EP 3556902 A1 * 10/2019 ............. C23C 14/34
JP 60-131966 A 7/1985
(Continued)

*Primary Examiner* — John J Brayton
(74) *Attorney, Agent, or Firm* — Kolitch Romano Dascenzo Gates LLC

(57) ABSTRACT

The invention relates to a diaphragm assembly of an aperture diaphragm for delimiting the coating region which is operative in the deposition of a layer and to a sputtering device which uses the diaphragm assembly. The diaphragm assembly comprises a main part (13) which has a passage (14) delimited by a passage edge. The aim of the invention is to design the diaphragm opening to be temporally and geometrically variable in situ. This is achieved in that the diaphragm assembly has at least one diaphragm plate (17, 17', 17") which is assembled on the main part (13) so as to be movable in front of the passage (14) and back. The diaphragm assembly additionally comprises a movement device which is operatively connected to the diaphragm plate (17, 17', 17") in order to carry out the movement thereof.

18 Claims, 5 Drawing Sheets

Figure 1A:
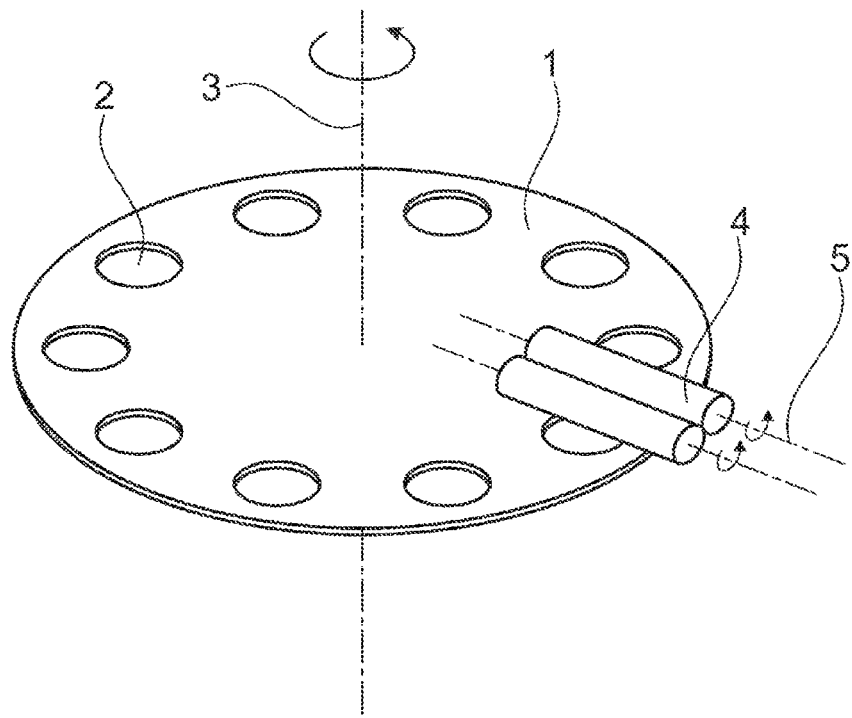

(51) Int. Cl.
    *C23C 14/50*   (2006.01)
    *C23C 14/54*   (2006.01)
(58) Field of Classification Search
    USPC .................................................. 204/298.11
    See application file for complete search history.

(56) References Cited

U.S. PATENT DOCUMENTS

| | | | |
|---|---|---|---|
| 5,156,727 A | 10/1992 | Bjornard et al. | |
| 2003/0085115 A1* | 5/2003 | Tani | C23C 14/044 |
| | | | 204/192.13 |
| 2003/0129325 A1* | 7/2003 | Kandaka | G21K 1/062 |
| | | | 204/298.11 |

FOREIGN PATENT DOCUMENTS

| | | | |
|---|---|---|---|
| JP | 02250963 A | * | 10/1990 |
| WO | 2016/206708 A1 | | 12/2016 |

* cited by examiner

DIAPHRAGM ASSEMBLY FOR DELIMITING THE COATING REGION OF A SPUTTER SOURCE, AND SPUTTERING DEVICE

The invention relates in general to a diaphragm assembly of an aperture diaphragm for delimiting the coating area, which originates from a sputter source as a result of sputtering, as well as a sputtering device which includes such a diaphragm assembly.

A sputtering device typically includes a substrate holding device and one or more sputter sources for providing the vaporized coating material. Substrate and sputter source(s) are positioned opposite to one another in a coating section in a process gas under vacuum by means of the substrate holder and a suitable source holder in such a way that the coating material is deposited originating from the sputter source in a coating area on the substrate surface. To coat a plurality of substrates, these are moved relative to the sputter source during the sputtering.

The substrate arrangement is regularly carried out on the basis of the static nominal vapor distribution. Only static deviations in the transport direction can be compensated for by means of a movement of the substrates. The equalization in the tangential direction is carried out by means of a rotational movement of the substrates.

The coating area is viewed in general as that area between coating source and substrate surface to be coated within which a characteristic, directed, three-dimensional propagation of the vaporized coating material is provided. The coating area consists during the sputtering of a line of sight connection between at least one area of the target and at least one section of the substrate surface. The material propagation takes place in the coating area according to a process-specific and influenceable distribution characteristic, in contrast to scattered vapor. Such a line of sight connection for the coating area is established by the pressure range during sputtering, which, at approximately 10-4 to 10-2 millibar (mbar), is in a range in which the mean free path length of the vapor particles is large in relation to the target-substrate distance.

With respect to three-dimensionally formed substrate surfaces, those surface sections such as, analogous to flat substrates, side and rear surfaces or setbacks are not incorporated here, since they have no line of sight connection to the target as a result of the holder of the substrate. It is possible but usually not desired to turn the substrate and to also coat these surfaces in a next sputtering method.

According to the prior art, planar or cylindrical rotating magnetron sputter sources (planar magnetrons or tube magnetrons) are used as sputter sources. These are arranged above or below the substrates so that the atomized material propagates in the direction of the substrates and is deposited there.

Tube magnetrons comprise a cylindrical cathode, which is rotatable around its longitudinal axis. The lateral surfaces of these tube cathodes consist of target material which can be sputtered. The magnet system, which extends over the entire length of the tube target, is normally arranged in the interior of such a tube target. Planar magnetrons use plate-shaped targets having the magnet system located behind it instead of the tubular targets.

The critical reference of a sputter source is, in the case of planar magnetrons, that plane which is defined by the surface of the planar target and the magnet system arranged behind it, in parallel to the surface. In the case of rotating cylindrical magnetrons, the axis of rotation in the cylinder in conjunction with the magnet system aligned in parallel thereto is the defining axis of the sputter source. This plane or this axis defines the direction of action and solid angle distribution of the material vapor jet generated by sputtering, the so-called sputtering lobe.

The goal of a coating is normally to deposit a layer on a substrate which is homogeneous with regard to the layer thickness and the layer properties or follows a desired distribution, wherein the movement of the substrate is to be taken into consideration.

Figure 1B:
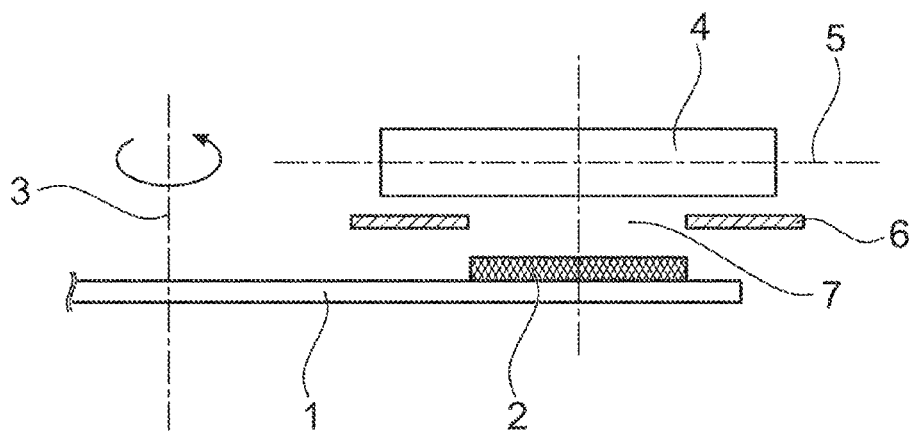

In FIG. 1A and FIG. 1B, a coating according to the prior art is described by way of example on the basis of a schematically illustrated arrangement, in which a large number of circular substrates 2 are arranged in a substrate holder, in the exemplary embodiment on a turntable 1. The turntable 1 rotates (illustrated by an arrow) around an axis of rotation 3, which is perpendicular to the surface of the turntable 1 and optionally at the same time to the surface of the substrates 2.

A sputter source 4, in the exemplary embodiment consisting of two parallel tube magnetrons having target tubes (double tube magnetron) rotating around their axes of rotation 5, is arranged above the substrates 2, from which the coating material is sputtered, propagates in the form of a characteristic material flow, normally lobe-shaped in the undisturbed state, and is deposited on the moving substrates 2.

FIG. 1B shows the arrangement of FIG. 1A in a sectional view.

Instead of the tube magnetrons shown, one or more planar magnetrons can also be used. Instead of the illustrated coating from above onto the substrate 2 (sputter down) the substrate can also be arranged above the sputter source (sputter up) (not shown).

If a substrate to be coated is moved past a stationary sputter source, the deposited material quantity and thus locally achievable layer thickness thus results from the static vaporization rate per unit of area of the source and the movement speed of the substrate. In vacuum coating facilities according to the prior art, both local and also chronological changes of the plasma distribution and the deposition rates are normally to be noted. In addition to the variations of the plasma distribution and deposition rates to be recorded over the spatial extension of the sputter source, for example, in the case of rotating or turning substrates, differences are also to be noted along the radial direction 8 (FIG. 2A) of the rotational movement. These are based on the different path speeds of each circular path and the different dwell times resulting therefrom of the respective units of area in relation to the sputter source.

Figure 2A:
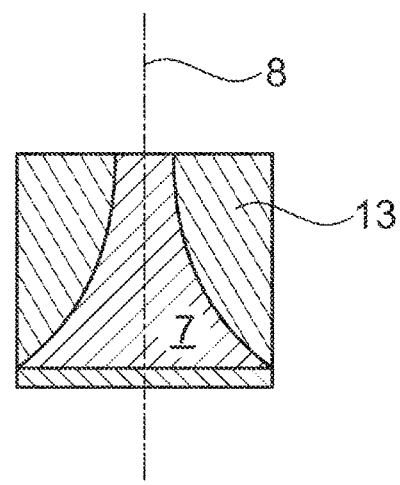
Figure 2B:
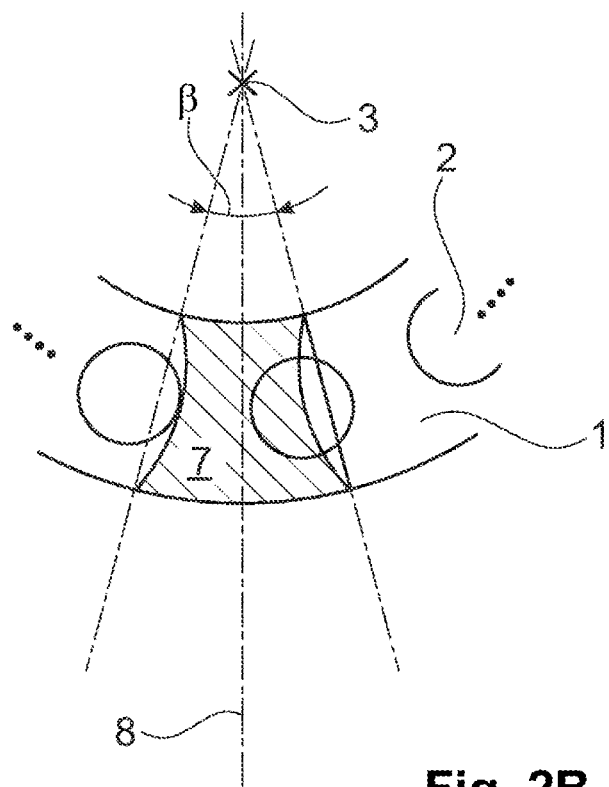

In order to counteract the differences of the deposition rates, according to the prior art, suitably shaped, stationary diaphragm assemblies 6 (FIG. 2B) having a suitable diaphragm opening 7 are used between substrate 2 and sputter source 4. In the case of turning or rotating substrates 2, the diaphragm openings 7 have an approximately trapezoidal shape. In this way, the rate differences on different circular paths can be compensated for. In the case of linearly moved substrates, the edge areas of the sputter source are often to be shielded. For the sake of better clarity, the diaphragm assembly of FIG. 2B is not shown in FIG. 2A.

One disadvantage of these solutions is the static diaphragm openings, at which chronological changes of the sputter conditions can only be compensated for in that the vacuum is interrupted and the coating chamber is opened in order to readjust the diaphragms. The required regular adaptation of the layer thickness is carried out by the following method steps. First, a sample coating is carried out and the layer thickness distribution is determined. On the basis thereof, a correction of the boundary edges of the diaphragm opening is determined empirically or by computer. The coating system is ventilated, the diaphragms are removed, and the diaphragm opening is modified. After the diaphragms are reinstalled, the system is again configured to the coating parameters and a further sample coating is performed. After its layer thickness measurement, the sequence sometimes has to be repeated again until the desired layer thickness homogeneity is achieved.

This sequence significantly reduces the operating time for deposition. Moreover, each interruption of the process and each opening of the system influences the coating, so that further sources, which are not necessarily predictable, of errors, thickness variations, and soiling of the layer have to be introduced and likewise have to be compensated for. In addition, it is intrinsic to the sputtering method that stable sputtering conditions cannot be maintained over a longer period of time. Thus, during a typical coating period of time of 1 to 2 days, deviations of the process parameters of +/−5% are to be noted. If deviations in the layer thickness homogeneity of less than +/−0.2% are required, it is clear that such high-quality layers can only be implemented using the known methods in a very cost-intensive and time-intensive manner.

The object of the invention is to specify the diaphragm assembly of an aperture diaphragm and a sputtering device having such a diaphragm assembly, the diaphragm opening of which is variable chronologically and geometrically and which permits the adaptation of the diaphragm opening in situ in order to increase the layer thickness homogeneity of the layer to be deposited and thus the profit of a coating process.

The invention is to be applicable in particular for tube magnetrons, but also for planar magnetrons, independently of whether the sputter source is designed as a single or multiple source.

The invention is to be applicable for the known sputtering devices, such as batch devices, feedthrough devices, individual chambers, and sputtering devices using which layers are deposited on circularly moving substrates, for example arranged on a turntable, or on rotating substrates. The invention is also to be applicable to rotating individual substrates, to individual substrates of which several are arranged fixedly on a rotatable substrate holder (turntable), and to those substrate holders using which planetary movements of the substrates can be implemented. Individual substrates rotating around the axis of rotation are also to be coated using the method and the device used for this purpose.

The subject matter of the invention is the diaphragm assembly of an aperture diaphragm, the diaphragm opening of which can be varied in situ, in that one or more diaphragm plates can be moved in front of the passage and back in such a way that they cover the diaphragm opening more or less and prevent sputter material from striking the substrate directly in the covered areas. The possible movements can be implemented by linear movements, a pivot, or a combination of both.

In this way, an absolute increase or reduction in size of the diaphragm opening is possible, as well as a locally differentiable change of the outline of the diaphragm opening. The variation of the size and shape of the diaphragm opening can take place in the course of the coating process and without chamber opening.

The subject matter of the invention is also a sputtering device which includes such a diaphragm assembly.

Such a diaphragm assembly comprises a main body, which includes a passage delimited by a passage edge. This defines the maximum settable diaphragm opening. The size and shape of the diaphragm opening are varied by means of at least one diaphragm plate.

The diaphragm plate is installed on the main body so that it is movable relative to the passage. In the case of the pivot, the diaphragm plate is pivotable around a pivot point D located on the main body in front of the passage and back. A combination of both types of movement can also provide that the component which forms the pivot point D is displaceable with the diaphragm plate relative to the passage.

A further optimization of the result is thus achievable. A displacement perpendicular to the direction of the substrate movement is preferred, i.e., in the case of a linear substrate movement, to one of the two sides of the substrate, and in the case of a rotational movement of the substrate, in the radial direction inward and/or outward. Such a displacement permits the lateral or the radial location of the sputtering lobe acting on the substrate to be varied. For such a displaceability of the sputtering lobe, it is obviously advantageous if the extension of the sputter source significantly exceeds that of the substrate surface in the relevant direction.

The movement "in front of the passage" is to be understood in such a way that the diaphragm plate, owing to its movement, protrudes in sections and variably, with respect to the line of sight connection between substrate surface and sputter source, over the passage edge of the main body into the passage. The shape and location of the main body and the diaphragm plate are matched to one another here in such a way that both components jointly prevent the diaphragm assembly from fulfilling its typical function of limiting the material flow and, accompanying this, the coating area on the substrate surface. For example, main body and diaphragm plate can be made plate-shaped.

The concept of the outline in its typical meaning describes the projection of the passage on a suitable, preferably horizontal plane, so that three-dimensionally shaped, for example curved passages are also included. A suitable plane can be, for example, the substrate surface or the transport plane in which the transport of the substrates takes place or another plane uniquely identifiable in the coating system.

This also applies to the main body and to the diaphragm plate matched to the main body. The concept of the "diaphragm plate" therefore designates an essentially plate-shaped component of the diaphragm assembly, which also includes three-dimensionally shaped "plates".

The passage of the main body can have a size and shape suitable for the respective sputtering method. For example, the outline can be designed in such a way that it reduces the systematic deviations of the deposition rates listed above or further known systematic deviations. It is normally adapted to the size and formation of the sputter source.

For the purpose of variation of size and shape of the diaphragm opening, the diaphragm assembly furthermore comprises a movement device, which is operationally connected to the diaphragm plate to execute its movement. The operational connection can be implemented via mechanical connecting means and manipulators or by electric drives having associated controller or by a combination of both. The movement device can be embodied in such a way that it enables a movement of the at least one diaphragm plate from outside the sputtering chamber.

If the diaphragm assembly includes multiple diaphragm plates, these can be moved independently of one another by means of the movement device. The design of the movement device is dependent, inter alia, on the components of the diaphragm assembly to be moved independently of one another, on the size of the diaphragm opening, on the type and extent of the movement, and on the type of the drive of the movement.

It has been established that the shape of that border section of the diaphragm plate has a significant influence on the homogenization of the layer properties which protrudes more or less into the passage as a result of the movement. That part of the border which can protrude into the passage due to the possible movement is also designated hereinafter as the "inner edge". In particular with rotating substrates, a large influence of the shape of the inner edge on the deposition rate has been established. Even a change of the shape of 1 mm resulted in rate variations of +/−1%, depending on the distance to the axis of rotation of the substrate.

It has been established in particular that a convex or concave curve, at least in sections, of the inner edge of the diaphragm plate has a significant influence on the layer homogenization.

The terms convex and concave are to relate only to the geometry of the diaphragm plate, not to the geometry of the diaphragm opening created by means of the diaphragm plates. With this way of observation, a convex curve of the inner edge of the diaphragm plate results in a greater constriction of the diaphragm opening due to its curve protruding further into the diaphragm opening, in comparison to a concave curve of the inner edge of the diaphragm plate, with otherwise identical position of both diaphragm plates.

The combination of both types of curve in direct succession and/or with supplementary linear section resulted in such a variability in the size and shape of the diaphragm opening that it was possible to deliberately influence various variations in the deposition rate. Under certain circumstances, it can prove to be advantageous if the convex curve made up a greater component of the inner edge than the concave curve. Such a shape is formed, for example, in the bell shape.

In addition to the length of the one or other curvature and the combinations thereof, the desired local deposition rate can also be varied by the movement of the one or more diaphragm plates via the degree of the curvature. Type, extent, and location of the curve or curves of a diaphragm plate can be determined beforehand for a specific coating task by experiments or computer simulation.

According to a further embodiment of the diaphragm assembly, the diaphragm plate can be formed in two parts, in that two partial diaphragms located one on top of another are installed movably relative to one another, i.e., displaceable and/or pivotable around the same pivot point D. This embodiment permits, in addition to the above-described variations, the shape of the inner edge of the diaphragm plate formed from both partial diaphragms to be modifiable. For this purpose, both partial diaphragms are moved relative to one another so that they overlap more or less.

The adjustable relative positions of the diaphragm plates and/or partial diaphragms resulting from the embodiments also allow the creation of multiple diaphragm openings in only one diaphragm assembly.

In a further embodiment of the diaphragm assembly, the passage of the main body is designed in such a way that it is adapted to the relevant coating process, in particular its spatial vapor propagation to be expected, and to known inhomogeneities in the deposition rate. Accordingly, the outline of the passage essentially has the shape of a planar, simple n-polygon, wherein n is an element of the natural numbers (n∈N) and n>2. The variability of the design of the diaphragm opening by means of the at least one diaphragm plate permits the use of diverse passage geometries.

A planar, simple n-polygon is distinguished in that its corner points lie in one plane and that there are no further common points of two sides of the n-polygon except for the corner points.

The restriction "essentially" also includes those sides of the n-polygon which maintain its fundamental shape having n corners, but are not necessarily formed by a straight line. Such an n-polygon also includes the use of a circular passage. The passage preferably has 3, 4, 5, or 6 corners.

If the number of the n-polygons of the outline of such a passage is, according to a further embodiment, restricted to 10 or fewer, unique corner points and sides are formed at the typical passage sizes. A pivot point D used for the pivoting of one of the one or more diaphragm plates used can thus be arranged on one of the corner points or on a side edge of the n-polygon. As a result, the passage can be modified in various ways. For example, a corner can be formed by a concave or convex inner edge, wherein the radius is defined, for example, by the technical possibilities for producing the main body. Or the passage includes a linear or curved side edge, which is covered, for example, by a more or less strongly curved inner edge of a diaphragm plate, which protrudes into the passage.

In a modification of this embodiment, the diaphragm assembly includes two diaphragm plates, the pivot points D of which lie on two adjacent corner points of the passage or two corner points diagonally opposite to one another due to which the above-described adjustment options can be amplified and/or made symmetrical.

Alternatively, the passage can be adapted to known or previously determined characteristics of the vapor distribution by means of an outline of the passage, which is bounded by a free-form curve. Free-form curves are two-dimensional and three-dimensional curves which have to meet known boundary conditions in order to fulfill a specific purpose. They are described by piecemeal polynomial functions and modeled by means of computer-aided design (CAD).

The arrangement of the one or more pivot points of the rotatable diaphragm plates is linked in this case to the design of the free curve. Depending thereon and similarly to the arrangement of the pivot points on an n-cornered passage, for example, two or more pivot points can be arranged adjacent to one another or spaced apart from one another in order to achieve the desired variation of the diaphragm opening.

A sputtering device which uses such a diaphragm assembly includes, in addition to the fundamental components mentioned above for the prior art and the surrounding vacuum chamber, an aperture diaphragm having the above-described diaphragm assembly. The aperture diaphragm is arranged inside the vacuum chamber between the substrate surface to be coated and the sputter source.

Furthermore, the sputtering device includes such a movement device, which is operable from outside the vacuum chamber by means of a suitable control unit. The control unit alternatively includes mechanical, pneumatic, hydraulic, or electrical transmission means and/or drives, which are guided in the vacuum chamber or arranged therein to move the at least one diaphragm plate therein. Various embodiments are available to a person skilled in the art for such transmission means and drives, using which they operate other components arranged inside the vacuum chamber when the chamber is closed.

According to one embodiment of the sputtering device, the substrate holder is designed to execute a circular and/or rotating movement of the substrate around a central axis of rotation of the substrate holder. Such turntables hold one substrate or several thereof on a rotating plate-shaped holder.

The diaphragm assemblies of such turntable systems normally have a quadrilateral, preferably trapezoidal basic shape of the diaphragm opening. The systematic deposition rates dependent on the radius of the respective circular path are to be equalized by means of the trapezoid shape.

Studies of layer thicknesses of circularly moving or rotating substrates have shown, however, that the homogenization thereof places high demands on the diaphragm assembly. In addition to the above-described different deposition rates in the radial direction, different dependencies on the distance to the target center are to be taken into consideration. In addition, there are second-order effects reducing the layer homogeneity, such as unavoidable mechanical or physical manufacturing tolerances. These are, for example, the magnetic field strength and the relevant angle of the magnetic flux. These also include the reproducibility of the installation locations or the height of the target above the substrate, which increases with increasing duration of the coating.

In particular the last-mentioned effects prevent the size and shape of the diaphragm opening at the beginning of the coating being able to be accurately predicted enough for the further process to achieve the required layer homogeneity.

Due to the variable geometry of the diaphragm opening, the known trapezoidal passages, but also any other passage geometries can be used.

While known long-term effects, such as uniformity changes with increasing target service life, can also be compensated without regular layer thickness measurements. For automated sputtering devices, the implementation of an in situ measuring system for the layer thickness enables a thickness regulation with closed control loop, however. Unknown effects are thus also to be reduced or compensated. Such a control loop uses the feedback signals from suitably positioned sensors, such as an optical thickness measuring system at various transport paths, to reduce errors and improve the homogeneity of the layer thickness and optionally also the optical-electrical layer properties.

The invention is also to include other installation situations of the substrates in a substrate holder.

During the coating method executed using such a sputtering device, the substrate is guided past a sputter source in the course of its movement. During this, the sputter material is deposited on the substrate surface to be coated in a coating area, wherein this is defined by the diaphragm opening of the above-described diaphragm assembly arranged between substrate and sputter source.

During the coating, the geometry and/or the area of the diaphragm opening is varied in situ by means of at least one diaphragm plate, in that the diaphragm plate which is installed movably, for example pivotably around a pivot point D, on the main body of the diaphragm assembly, is moved according to a predefined path in such a way, in particular pivoted, that the passage of the main body is more or less closed. The movement of the one or more diaphragm plates takes place in such a way that the boundary of the passage is covered at least in sections and thus the size and shape of the passage is varied.

The coating method which the sputtering device according to the invention uses comprises, for example, the following steps:

Initially, a test substrate is coated and its layer thicknesses and layer thickness and/or layer property distribution is ascertained, as is known from the prior art.

On this basis, the correction of the boundary of the diaphragm opening is calculated and the setting of the diaphragm plate(s) and possibly their partial diaphragms is performed by means of the movement device of the diaphragm assembly.

A further test substrate is coated using this setting to determine to what extent the desired layer thickness distribution was achieved for the start.

As soon as this is the case, the actual coating process can begin. In the course of the coating, occurring and established inhomogeneity is detected by means of an in situ measuring system. A correction algorithm developed for this purpose can be used for this purpose.

The correction values thus determined are used for the in situ readjustment of the diaphragm plate(s) and possibly partial diaphragms by means of the movement device.

In summary, it can be stated that the diaphragm assembly according to the invention permits the setting of the diaphragm opening with an accuracy of less than +/−0.2 mm. Inhomogeneities of the vapor source are to be compensated for better than using the solutions of the prior art by a deliberately settable location of the inner edge of the at least one diaphragm plate and thus also of the location of the diaphragm opening relative to the sputter source. Higher deposition rates can also be achievable due to the differentiated and precisely settable diaphragm opening.

Optionally, one or more than one, preferably two diaphragm plates can be used. While higher coating rates can be achieved with only one diaphragm plate in comparison to two or more of them, several diaphragm plates permit higher degrees of freedom in the setting, which can prove to be advantageous in particular for nonlinear inhomogeneities.

The setting is moreover locally differentiable by means of the shape of the inner edges of the diaphragm plates. As a result, the layer homogeneity and, under certain circumstances, also the efficiency of layer depositions are increased over the prior art using the diaphragm assembly according to the invention. In particular in turntable coating facilities, layer thicknesses having deviations of less than +/−0.2% were achievable.

Figure 3A:
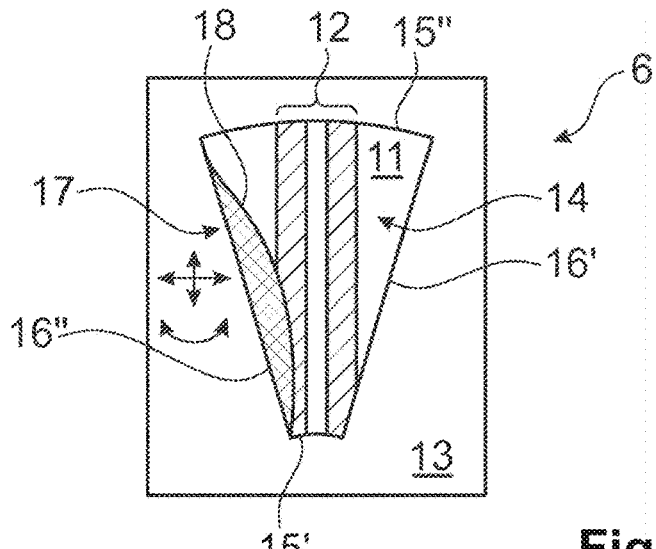
Figure 3B:
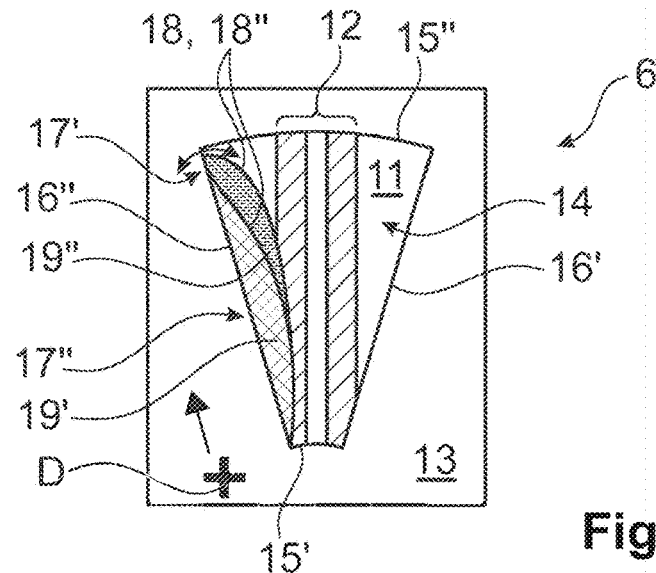
Figure 3C:
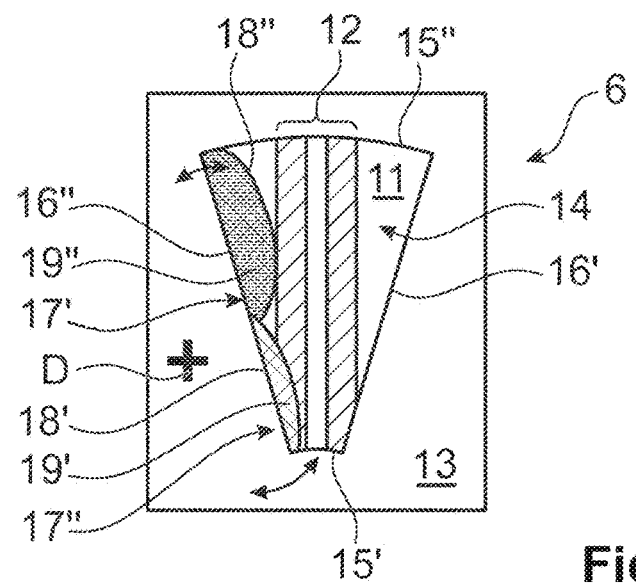

The invention is to be explained in more detail hereinafter on the basis of an exemplary embodiment. In the associated drawing FIG. 1A, FIG. 1B show a sputtering device having turntable and double tube magnetron according to the prior art in a perspective view and a sectional view, FIG. 2A-FIG. 2B show embodiments of a diaphragm assembly according to the prior art, FIG. 3A-FIG. 3C show embodiments of the diaphragm assembly according to the invention having diaphragm plates arranged on one side looking toward the sputter sources, FIG. 4A-FIG. 4D show embodiments of the diaphragm assembly according to the invention having diaphragm plates arranged on two sides looking toward the sputter sources, and FIG. 5 show schematic illustrations of a sputtering device according to the invention.

The exemplary embodiments of the invention (FIGS. 3A to 5) are to explain the invention only by way of example and not restrictively. A person skilled in the art would combine and modify the features implemented above in the various embodiments of the invention and hereinafter in the exemplary embodiment in further embodiments if it appears expedient and reasonable to them.

The drawings show the device or components thereof only schematically to the extent as required to explain the invention. They make no claim of completeness or dimensional accuracy.

FIGS. 3A to 3C and 4A to 4D show the diaphragm assembly 6 according to the invention as such in the course of the coating of rotating substrates (not shown) with a selection of settings of the diaphragm opening 11. In the illustrations, the view looks through the diaphragm opening 11 at the sputter sources 12 located behind it. Double tube magnetrons are used by way of example, but not restrictively.

The diaphragm assembly 6 comprises in each case a main body 13, which includes a passage 14. The passage 14 has an essentially trapezoidal footprint, wherein, by way of example but not restrictively, the two (inner and outer) base sides 15', 15" are in the form of a circular arc, in a minor deviation from a regular trapezoid shape. The inner base side 15', i.e., the one located closer to the axis of rotation (not shown) of the substrate holder, is the shorter one here.

The aperture diaphragms are each arranged in front of the respective sputter source 12 so that both components are symmetrical to one another and the height of the trapezoid is parallel to the axes of the tube magnetron. This location of the two components is also only given by way of example, but is not restrictive.

In the simplest embodiment, a diaphragm plate 17, which is movable relative to the main body, is installed on one of the two legs 16', 16". The type of the movement can be any of those mentioned above and is symbolized in the figures by corresponding double arrows.

In the situation illustrated in FIG. 3A, the diaphragm plate 17 protrudes into the passage 14 along one of the two legs 16", over nearly its entire length, and constricts it. The inner edge 18 of the diaphragm plate 17 includes a convex curve, at least in the visible area, so that the passage is constricted most in the middle, but not at all adjoining the legs 15', 15".

The further exemplary embodiments of FIG. 3B and FIG. 3C and also FIG. 4A to FIG. 4D have the same fundamental structure of the diaphragm assembly, solely for better illustration of the differences and comparability thereof, with regard to main body, shape of the passage, and embodiment of the sputter source. These components are obviously not restricted to the illustrated embodiments.

The diaphragm assembly of FIG. 3B includes a two-part diaphragm plate 17, which only protrudes at one leg 16" into the passage 14, as described for FIG. 3A. Both partial diaphragms 19', 19" overlap in a section, so that one of them protrudes further into the passage 14 in the outer section of the passage 14 than the other. The two partial diaphragms 19', 19" again include by way of example, but not restrictively, a convex curve at least in the visible area, wherein the curve of one partial diaphragm 19" has a curve becoming stronger toward the outer base side 15".

The movement executable using the diaphragm plate 17 in this exemplary embodiment is a pivot movement of both partial diaphragms jointly (shown by only one double arrow) around a pivot point D (shown by a cross), which is arranged adjacent to that corner of the passage 14 which the leg 16" covered by the diaphragm plate 17 adjoins. Due to the pivoting of the partial diaphragms 19', 19", their inner edges 18', 18" can be positioned further into or out of the passage 14. Alternatively, both partial diaphragms 19', 19" can pivot around the same pivot point D independently of one another.

The exemplary embodiment of FIG. 3C is a modification of the exemplary embodiment of FIG. 3B. The pivot point D of the two partial diaphragms 19', 19" is arranged here approximately in the middle of the leg 16", which is to be modified by means of the diaphragm plate 17. By pivoting both partial diaphragms 19', 19" in one or the other direction (shown by two double arrows), the outer and the inner section of this leg 16" can be modified significantly differently from one another.

The exemplary embodiments of FIG. 4A to FIG. 4D differ in particular from those described above in that both legs 16', 16" of the essentially trapezoidal passage 14 each include a movable diaphragm plate 17', 17", as described for FIG. 3A. Reference can thus be made to the descriptions there.

Figure 4A:
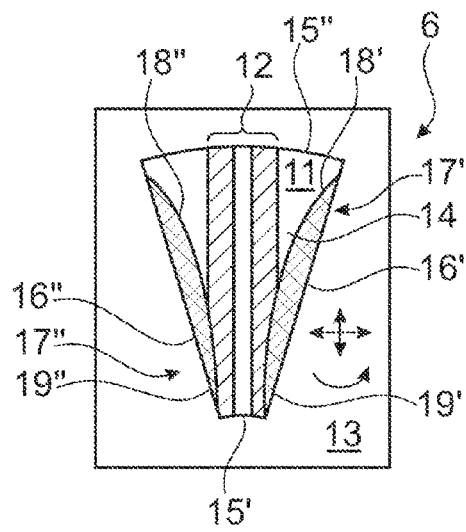
Figure 4B:
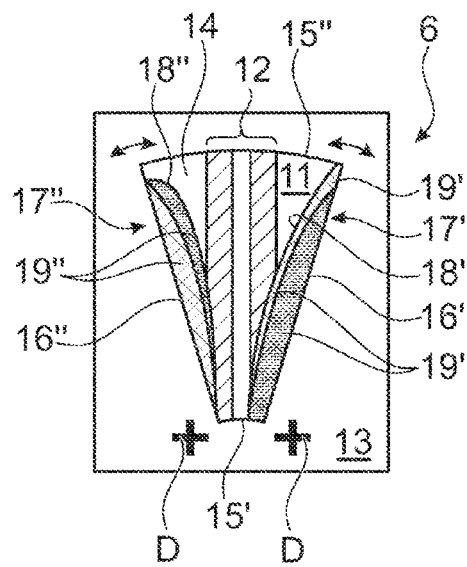
Figure 5:
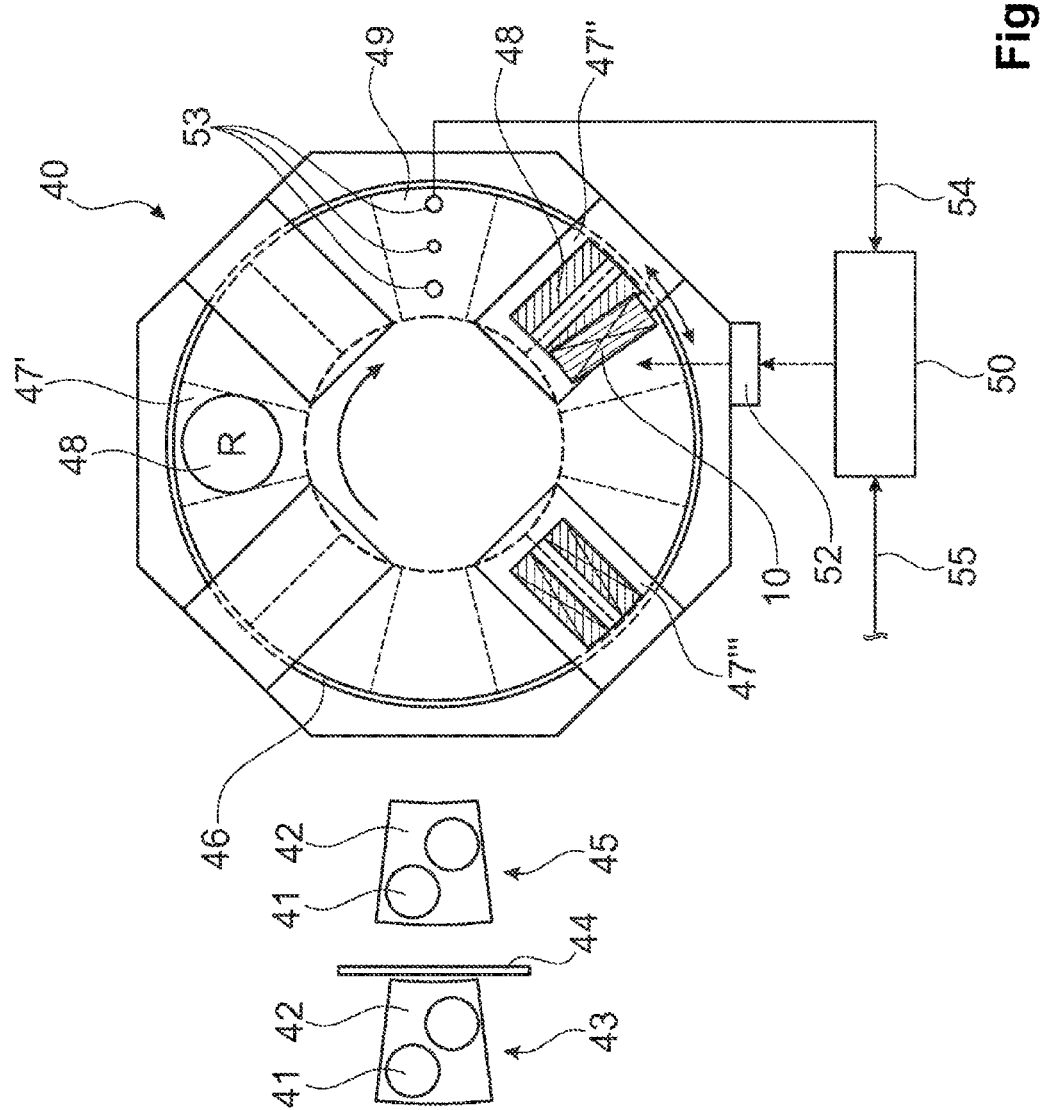

In a comparable manner, in FIG. 4B a two-part diaphragm plate 17', 17" is likewise installed pivotably around a pivot point D in each case at both legs 16', 16". The partial diaphragms 19', 19" also have curves differing from one another here, so that the setting options for the ultimately effective diaphragm opening 11 can be further diversified. Reference is made to the descriptions of FIG. 3B with regard to the locations of the partial diaphragms and their pivot points and the settings resulting therefrom.

Figure 4D:
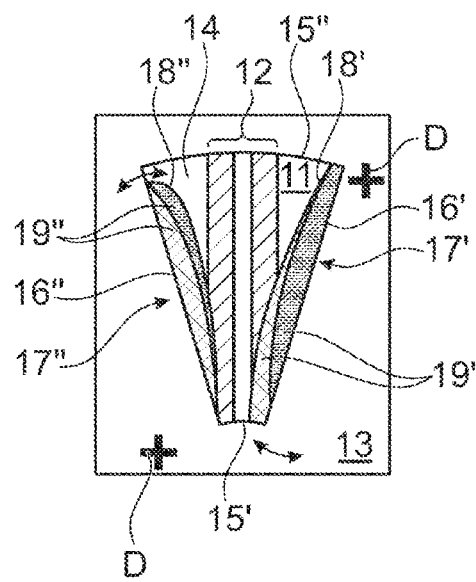
Figure 4C:
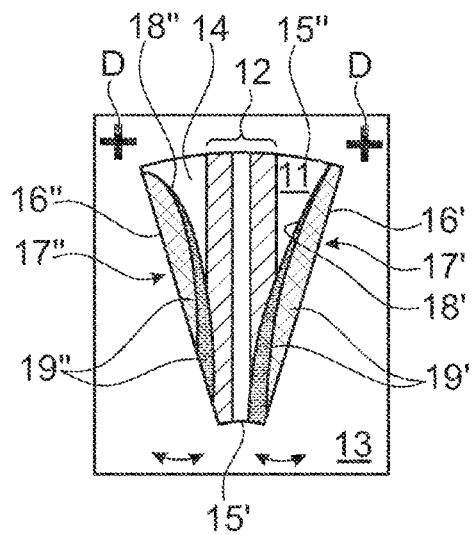

The embodiment of FIG. 4C differs from that of FIG. 4B in that the pivot points D are arranged at the corner points between one of the legs 16', 16" and outer base side 15". This has the result that due to the pivoting of the diaphragm plates 17', 17", the inner section of the diaphragm opening 11, which has a greater distance to the pivot points D, is modifiable significantly more sensitively. In that the pivot points D are positioned differently at both legs 16', 16", the two sides of the passage can be modified with different sensitivities (FIG. 4D).

An extraordinary variety of setting options is available by further combinations of the features described with respect to FIG. 3A to FIG. 3C and FIG. 4A to FIG. 4D and by further modifications of the inner edges of the diaphragm plates and partial diaphragms connected to modifications of the passage and its movements, in order to compensate for local variations of the deposition rate in a locally differentiated manner or, vice versa, to deliberately induce them.

FIG. 5 schematically shows the essential components of a sputtering device 40 according to the invention, which uses one of the above-described diaphragm assemblies 6 in its diaphragm assemblies.

The sputtering device 40 has an essentially circular structure and includes multiple stations distributed on its circumference, which are used directly or indirectly for coating substrates 41 with a layer which shows the desired distribution of the layer thickness and/or layer properties.

The substrates 41 are arranged in carrier segment 42 of the substrate holder (not shown) and are introduced by means of a loading station 43, which is separated by a vacuum airlock 44 from the area of the sputtering device under vacuum, into a handling station 45.

The substrates 41 are placed there on the turntable 46 rotating clockwise (shown by arrow), for example. Due to a step-by-step rotation of the turntable 46 by means of a suitable rotation unit (not shown), the substrates 41 gradually pass through the individual stations of the sputtering device 40 including the coating station(s), so that the carrier segments 42 having coated substrates 41 can be removed at the handling station 45.

FIG. 5 shows a first process chamber 47', in the rotational direction, having a sputter source 48 for coating the substrates 41. In a following monitoring chamber 49 in the clockwise direction, which shows the required measurement technology, the layer thicknesses and possibly further properties, such as the transparency or the surface resistance, are measured at multiple measurement points 53 known to be significant on the substrate 41. For example, two, three (FIG. 5), or more measurement points can be adjacent to one another in the radial direction, so that the desired homogenization of the layer thickness in the radial direction using the diaphragm assembly according to the invention is to be determined. Alternatively or additionally, measurement points 53 can also be positioned differently to obtain further information. Preferably, n measuring channels (not shown) are assigned to the m (m∈N with m>0) measurement points 53.

The measured values 54 are transferred to a control unit 50 for the comparison to the target values 55, so that the correction settings for the diaphragm assembly provided in one or possibly multiple subsequent process chambers 47", 47'" are to be determined therefrom by means of a suitable algorithm.

A drive unit 52 is activated by means of the control unit 50 in order to pivot and/or display the diaphragm plates (not shown) and possibly partial diaphragms (also not shown) of the diaphragm assembly 51 in such a way that the desired coating result is achieved.

In the illustrated sputtering device, the diaphragm opening is completely closed by way of example, but not restrictively, in the third process chamber 47'".

LIST OF REFERENCE SIGNS 1 substrate holder, turntable
2 substrate
3 axis of rotation
4 sputter source
5 axis of rotation
6 diaphragm assembly
7 diaphragm opening
8 radial direction
11 diaphragm opening
12 sputter source
13 main body
14 passage
15' inner base side
15" outer base side
16', 16" leg
17, 17', 17" diaphragm plate
18, 18', 18" inner edge
19', 19" partial diaphragms
40 sputtering device
41 substrate
42 segment
43 loading station
44 vacuum airlock
45 handling station
46 turntable
47', 47", 47'" process station
48 sputter source
49 monitoring chamber
50 control unit
52 drive unit
53 measurement point
54 measured values
55 target values
D pivot point

The invention claimed is:

1. A diaphragm assembly of an aperture diaphragm for delimiting a coating area active for a layer deposition, the diaphragm assembly comprising:
a main body comprising a passage delimited by a passage edge;
at least one diaphragm plate installed on the main body, wherein the at least one diaphragm plate is movable in front of the passage and back, and wherein the at least one diaphragm plate comprises two partial diaphragms configured to pivot independently of one another about a pivot point such that an inner edge of each partial diaphragm selectively covers at least a portion of the passage; and
a movement device operationally connected to the at least one diaphragm plate to execute movement of the two partial diaphragms.

2. The diaphragm assembly of claim 1, wherein the at least one diaphragm plate is installed pivotably in front of the passage and back around the pivot point lying on the main body.

3. The diaphragm assembly of claim 1, wherein the two partial diaphragms are displaceable relative to one another and/or are pivotable about the pivot point relative to the passage.

4. The diaphragm assembly of claim 1, wherein the inner edge is movable in the passage and comprises a convex curve or a concave curve at least in sections.

5. The diaphragm assembly of claim 1, wherein the two partial diaphragms are arranged lying one on top of another and installed movably in relation to one another.

6. The diaphragm assembly of claim 5, wherein the two partial diaphragms are pivotable independently of one another by the movement device.

7. The diaphragm assembly of claim 1, wherein the at least one diaphragm plate comprises two diaphragm plates, wherein the two diaphragm plates are pivotable independently of one another by the movement device.

8. The diaphragm assembly of claim 1, wherein an outline of the passage essentially has a shape of a polygon, or wherein the outline of the passage is bounded by a free-form curve.

9. The diaphragm assembly of claim 1, wherein an outline of the passage essentially has a shape of a polygon, wherein the polygon has greater than two sides and less than ten sides, and wherein the pivot point of the at least one diaphragm plate lies at a corner point or on a side of the polygon.

10. The diaphragm assembly of claim 1, wherein an outline of the passage essentially has a shape of a polygon, wherein the polygon has greater than two sides and less than ten sides, wherein the diaphragm assembly comprises two diaphragm plates, and wherein pivot points of the two diaphragm plates lie at two adjacent or at two diagonally opposing corner points or side edges of the polygon.

11. The diaphragm assembly of claim 1, wherein an outline of the passage is bounded by a free-form curve, and wherein the pivot point of the at least one diaphragm plate lies on the main body.

12. The diaphragm assembly of claim 1, wherein an outline of the passage is bounded by a free-form curve, wherein the diaphragm assembly comprises two diaphragm plates, and wherein pivot points of the two diaphragm plates lie on the main body at two adjacent or two diagonally opposing points of the passage.

13. A sputtering device for sputtering a layer on a substrate, the sputtering device comprising:
- a vacuum chamber;
- a source holder in the vacuum chamber;
- a sputter source held by the source holder;
- a substrate holder configured to hold the substrate relative to the sputter source and move the substrate during the sputtering; and
- the diaphragm assembly of claim 1 arranged between the sputter source and the substrate, wherein the diaphragm assembly is operable from outside the vacuum chamber.

14. The sputtering device of claim 13, wherein the substrate holder is configured to execute a circular or rotating movement of the substrate around a central axis of rotation of the substrate holder.

15. The sputtering device of claim 13, wherein the sputtering device comprises a measuring unit for measuring a layer thickness of the layer.

16. The sputtering device of claim 15, wherein the measuring unit is configured such that a measurement of the layer thickness of the layer takes place at two, three, or more measurement points on the layer.

17. A diaphragm assembly of an aperture diaphragm for delimiting the coating area active for a layer deposition, the diaphragm assembly comprising:
- a main body comprising a passage delimited by a passage edge;
- a diaphragm plate installed on the main body, wherein the diaphragm plate is configured to pivot about a pivot point arranged on the main body in a first direction to at least partially cover the passage and in a second direction to uncover the passage, wherein the pivot point is configured to translate relative to the passage; and
- a movement device operationally connected to the diaphragm plate to execute movement of the diaphragm plate.

18. The diaphragm assembly of claim 17, wherein the pivot point is configured to translate in a direction perpendicular to a direction of movement of a substrate when the substrate is moved relative to the main body.

* * * * *